(12) United States Patent
Khalil

(10) Patent No.: US 8,106,451 B2
(45) Date of Patent: Jan. 31, 2012

(54) MULTIPLE LATERAL RESURF LDMOST

(75) Inventor: Sameh Khalil, Irvine, CA (US)

(73) Assignee: International Rectifier Corporation, El Segundo, CA (US)

(*) Notice: Subject to any disclaimer, the term of this patent is extended or adjusted under 35 U.S.C. 154(b) by 939 days.

(21) Appl. No.: 11/888,720

(22) Filed: Aug. 2, 2007

(65) Prior Publication Data
US 2008/0029814 A1    Feb. 7, 2008

Related U.S. Application Data

(60) Provisional application No. 60/821,155, filed on Aug. 2, 2006.

(51) Int. Cl.
H01L 29/78 (2006.01)

(52) U.S. Cl. ........................................ 257/339

(58) Field of Classification Search .......... 257/335–339, 257/183, 487–496, 471, E29.256, 115, 140, 257/146, 147, 409, 330, 343, 344, 370, 373, 257/379, 380, E29.04, E29.128, E29.136, 257/E29.255, E29.268, E29.279, E29.012, 257/E29.185, E23.08
See application file for complete search history.

(56) References Cited

U.S. PATENT DOCUMENTS

| 6,528,849 | B1* | 3/2003 | Khemka et al. | 257/342 |
| 7,629,631 | B2* | 12/2009 | Yilmaz | 257/260 |
| 2004/0084744 | A1* | 5/2004 | Khemka et al. | 257/492 |
| 2004/0238913 | A1* | 12/2004 | Kwon et al. | 257/492 |
| 2005/0218431 | A1* | 10/2005 | Nair et al. | 257/262 |
| 2006/0267089 | A1* | 11/2006 | Khemka et al. | 257/341 |
| 2006/0284276 | A1* | 12/2006 | Yilmaz | 257/492 |
| 2008/0093641 | A1* | 4/2008 | Ludikhuize et al. | 257/289 |
| 2008/0179663 | A1* | 7/2008 | Terashima | 257/328 |

OTHER PUBLICATIONS

"A New 800V Lateral MOSFET With Dual Conduction Paths"—pp. 399-402—D.R. Disney, A.K. Paul, M. Darwish, R. Basecki, V. Rumennik—Proceedings of 2001 International Symposium on Power Semiconductor Devices & ICs, Osaka.

* cited by examiner

Primary Examiner — Dao H Nguyen
Assistant Examiner — Tram H Nguyen
(74) Attorney, Agent, or Firm — Farjami & Farjami LLP

(57) ABSTRACT

A lateral DMOS transistor that includes two RESURF regions of one conductivity and two RESURF regions of another conductivity disposed between the base region and the drain region thereof.

15 Claims, 3 Drawing Sheets

MULTIPLE LATERAL RESURF LDMOST

RELATED APPLICATION

This application is based on and claims priority to the of U.S. Provisional Application Ser. No. 60/821,155, filed on Aug. 2, 2006, entitled Multiple RESURF Lateral RESURF LDMOST, to which a claim of priority is hereby made and the disclosure of which is incorporated by reference.

FIELD OF INVENTION

The present application relates to high voltage lateral DMOS transistors that include RESURF regions.

BACKGROUND AND SUMMARY OF THE INVENTION

Lateral DMOS transistors that include one RESURF region in a RESURF drift region are known. Such devices include either two RESURF regions of opposite conductivity (double RESURF), or one RESURF region of one conductivity and two RESURF regions of another conductivity (triple RESURF). A lateral RESURF LDMOST derived from the conventional RESURF LDMOST is disclosed in D. R. Disney, A. K. Paul, M. Darwish, R. Basecki and V. Rumennik, "A New 800V Lateral MOSFET with Dual Conduction Paths," International Symposium on Power Semiconductor Devices and Ics (ISPSD), pp. 399-402, 2001.

A device according to the present invention includes two RESURF regions of one conductivity, and two RESURF regions of another conductivity disposed between the base region and the drain region thereof. Thus, a device according to the present invention is a quadruple RESURF device.

A device according to the present invention is believed to have an improved trade-off between the on-state resistance ($R_{dson}$) and the breakdown voltage (BV) over the prior art. For example, a factor of two reduction in $R_{dson}$ is expected. The significant reduction in $R_{dson}$ will result in smaller devices for a given current carrying capability which in turn reduces parasitic capacitances and improves speed of the performance of the device.

Other features and advantages of the present invention will become apparent from the following description of the invention which refers to the accompanying drawings.

DETAILED DESCRIPTION OF EMBODIMENTS OF THE INVENTION

Figure 1:
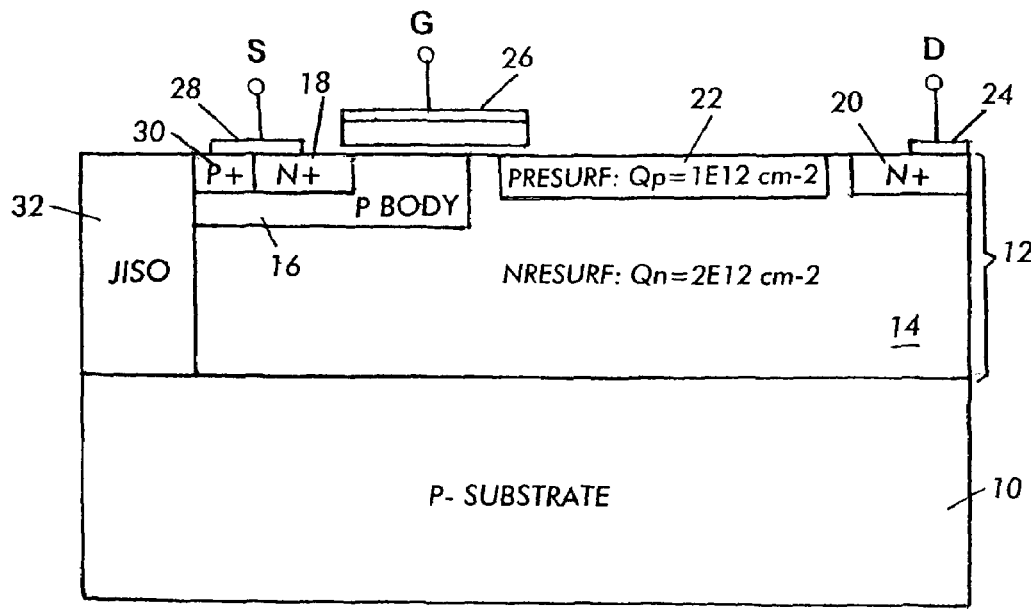
FIG. 1 shows a cross-sectional view of an LDMOST according to one design.

Referring to FIG. 1, a high voltage RESURF lateral DMOS transistor (LDMOST) according to the prior art includes a substrate 10 of one conductivity (e.g. P type) and a high voltage LDMOST 12 formed on one surface of substrate 10. LDMOST 12 includes a drift region 14 of another conductivity type (e.g. N-type) having a RESURF conductivity, a base region 16 of the one conductivity formed in drift region 14, source region 18 of another conductivity formed in base region 16, a drain region 20 of another conductivity formed in drift region 14 and laterally spaced from base region 16, a single RESURF region 22 of the one conductivity having a RESURF conductivity formed at the top surface of drift region 14 (i.e. extending into drift region 14 from the top surface thereof) and spaced from base region 16 and drain region 20, a drain contact 24 ohmically coupled to drain region 20, a MOSGATE 26 disposed over at least base region 16, and source contact 28 ohmically coupled at least to source region 18, but preferably also ohmically coupled to high conductivity contact region 30 of the one conductivity, which is also formed in base region 16. Note that, as is well known, a junction isolation region 32 is provided to reside adjacent along preferably the entire thickness of device 12 (i.e. extending from substrate 10 along the entire thickness of device 12). Junction isolation region 32 is preferably a semiconductor region of a conductivity opposite to drift region 14 (i.e. the same conductivity as substrate 10).

Figure 2:
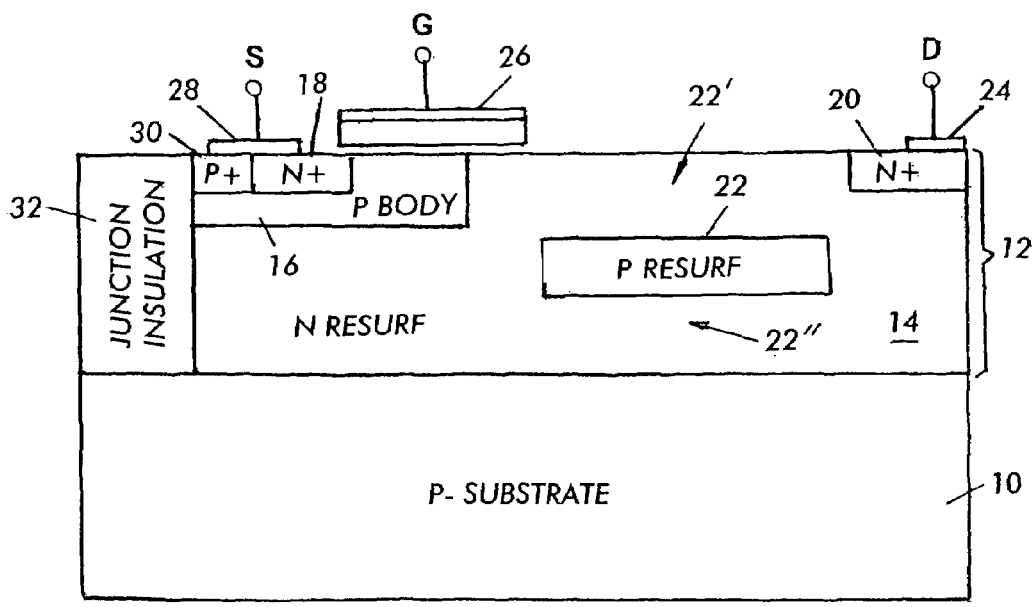
FIG. 2 shows a cross-sectional view of an LDMOST according to another known design.

Referring now to FIG. 2, in which like numerals identify like features, an LDMOST according to another know design, includes a single RESURF region 22 that is embedded inside drift region 14, and spaced from the top surface thereof. Thus, a device according to FIG. 2 includes three RESURF regions, region 22, RESURF region 22' (of opposite conductivity to region 22) extending from above region 22 to the top surface of drift region 14, and RESURF region 22" (of opposite conductivity to region 22) extending from the bottom of region 22 to substrate 10. Thus, a device according to FIG. 2, includes three RESURF regions 22, 22', 22", while a device according to FIG. 1 include two RESURF regions, region 22, and drift region 14. FIG. 1 thus shows a double RESURF design and FIG. 2 shows a triple RESURF.

The amount of charge in the drift region is typically 1E12 cm-2 in the conventional single RESURF, while it is 2E12 cm-2 in a conventional double RESURF because in a double RESURF device the drift region is depleted by the double RESURF action. As is known, the $R_{dson}$ of a known double RESURF LDMOST (available for example from the assignee of the present application) is limited by the amount of net charge in the drift region thereof.

In a triple RESURF device (FIG. 2), RESURF region 22 is embedded in drift region 14 to provide two separate current paths, region 22' and region 22". Region 22' typically has an integrated charge of 1E12 cm-2 and region 22" typically has an integrated charge of 2E12 cm-2. Thus, the total effective charge in regions 22' and 22" is 3E12 cm-2 which results in roughly 33% reduction in the on-state resistance (with respect to a Double RESURF LDMOST) while keeping the breakdown voltage the same for a given drift region length.

A device according to the present invention includes four RESURF regions (two of one conductivity, and two of another conductivity) disposed in the lateral region between the base region and the drain region of the device.

Figure 3:
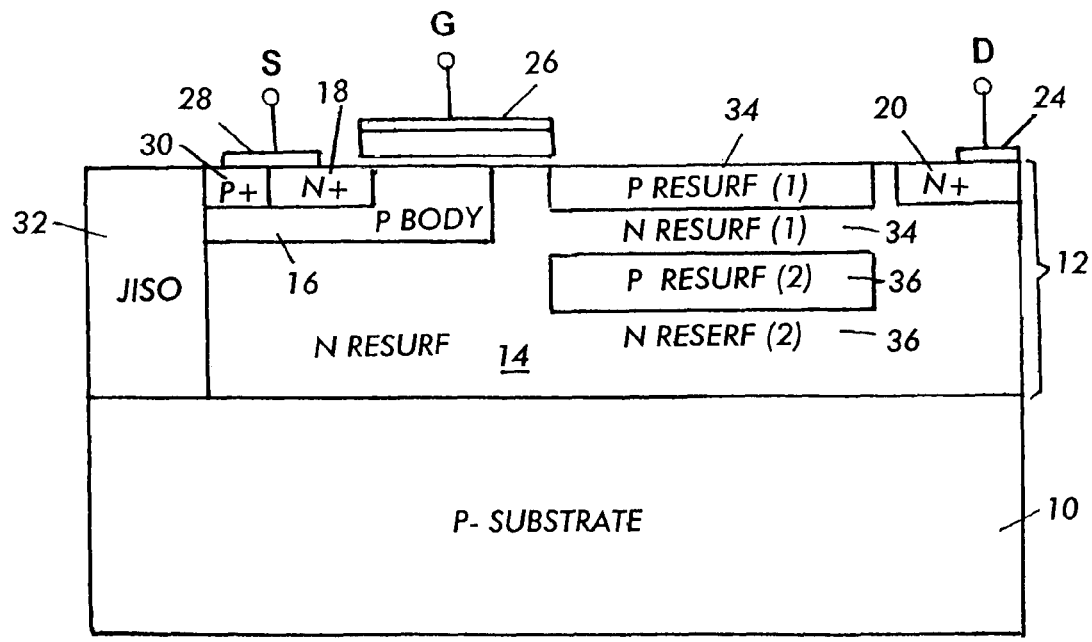
FIG. 3 shows a cross-sectional view of an LDMOST according to the first embodiment of the present invention.

Referring to FIG. 3, in which like numerals identify like features, a device according to the first embodiment of the present invention includes a first RESURF region 34 having a RESURF conductivity formed in drift region 14, and a second RESURF region 36 having a RESURF conductivity formed in drift region 14. First RESURF region 34 is adjacent the top surface of drift region 14 (i.e. extends from the top surface of drift region 14 (to a predetermined drift region 14), and is spaced from base region 16 and drain region 20. Second RESURF region 36 is formed below and spaced from first RESURF region 34 inside drift region 14. Thus, according to the present invention, there are two RESURF regions of one conductivity (regions 34, 36), and two RESURF regions of another conductivity (region 34', 36') disposed between base region 16 and drain region 20. Note that region 34' extends from the bottom of region 34 to the top of region 36, and region 36' extends from the bottom of region 36 to substrate 10.

First RESURF region 34 and second RESURF region 36 deplete drift region 14 during the off-state which in turn allows doubling the integrated charge. For example, the integrated charge can be increased to 2E12 cm-2 in each region 34', 36', increasing the overall charge in the drift region is to 4E12 cm-2.

In a device according to FIG. 1, RESURF region 22 is tied to ground through a low resistive path allowing fast sourcing/sinking of holes during switching. Similarly, it is desirable to ground RESURF region 36.

Figure 4:
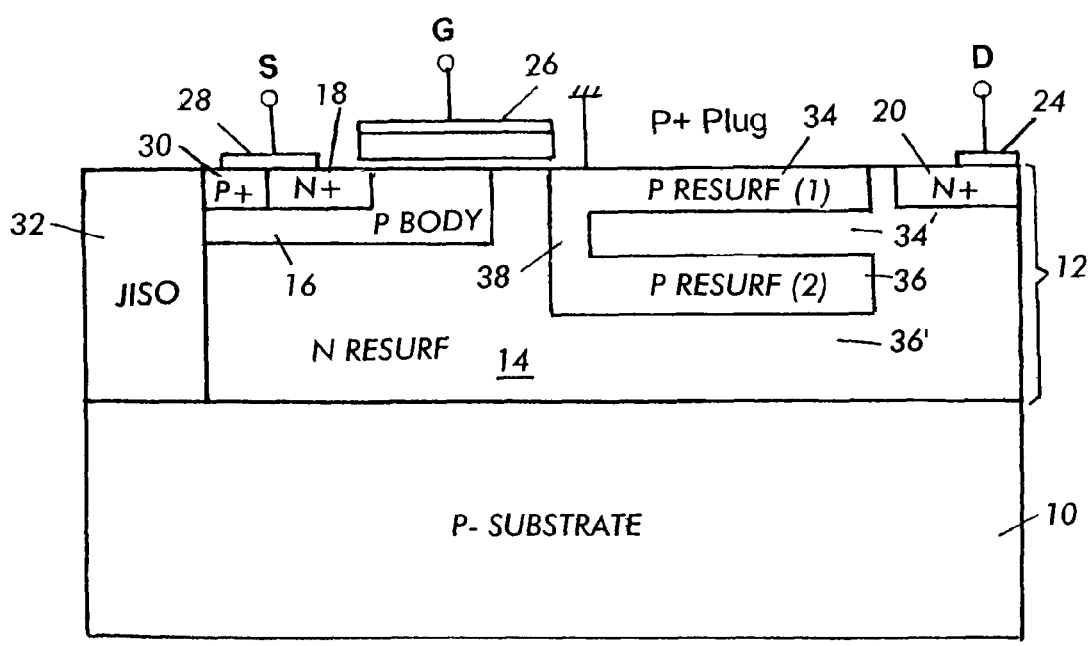
FIG. 4 shows a cross-sectional view of an LDMOST according to the second embodiment of the present invention.

Referring now to FIG. 4, in which like numerals identify like features, in a device according to the second embodiment of the present invention, a region 38 of high conductivity, and the same conductivity as RESURF regions 34, 36, is provided to extend into drift region 14, and link first RESURF region 34 and second RESURF region 36, whereby the two regions are connected electrically. Thus, RESURF region 36 is shorted to RESURF region 34, which is shorted to ground. Region 38 can be implemented using a boron ion implantation in an N-channel device. Preferably, regions 38 are provided on the side nearest to MOSGATE 26 and intermittently in a direction transverse to the flow of current with low frequency of repetition to minimize interference with the current flow in region 34'.

Figure 5:
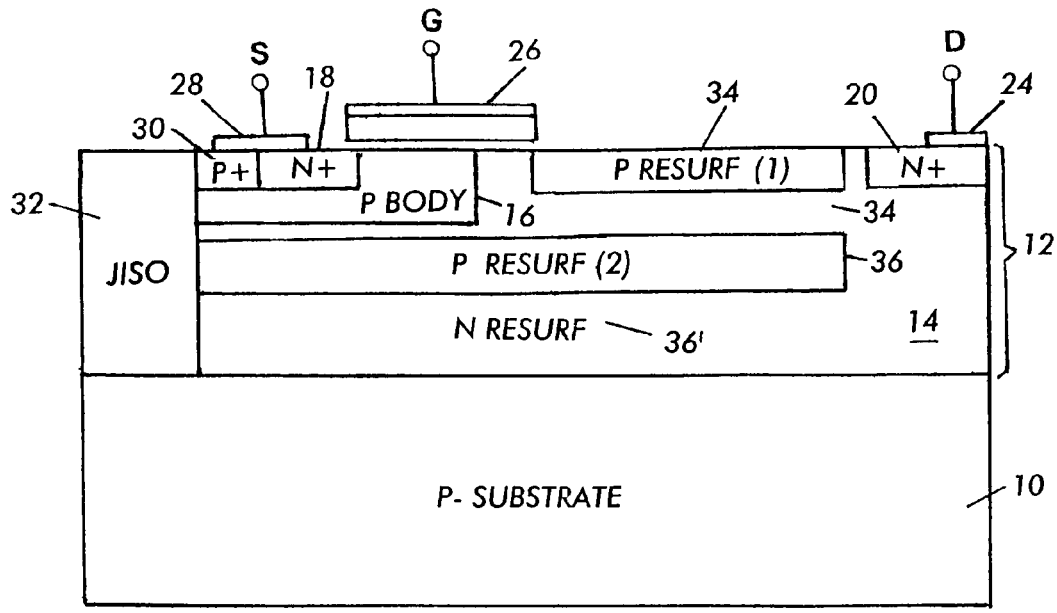
FIG. 5 shows a cross-sectional view of an LDMOST according to the third embodiment of the present invention.

Alternatively, RESURF region 36 can be extended laterally to junction isolation region 32 layer which is in turn connected to ground through a low resistive path. Referring now to FIG. 5, in which like numerals identify like features, in a device according to the third embodiment of the present invention, second RESURF region 36 laterally extends below base region 16 and preferably reaches (and is shorted to) junction isolation region 32. The extended RESURF region 36 is preferably provided intermittently with a low frequency of repetition to minimize blocking current from flowing into RESURF region 36'.

Figure 6:
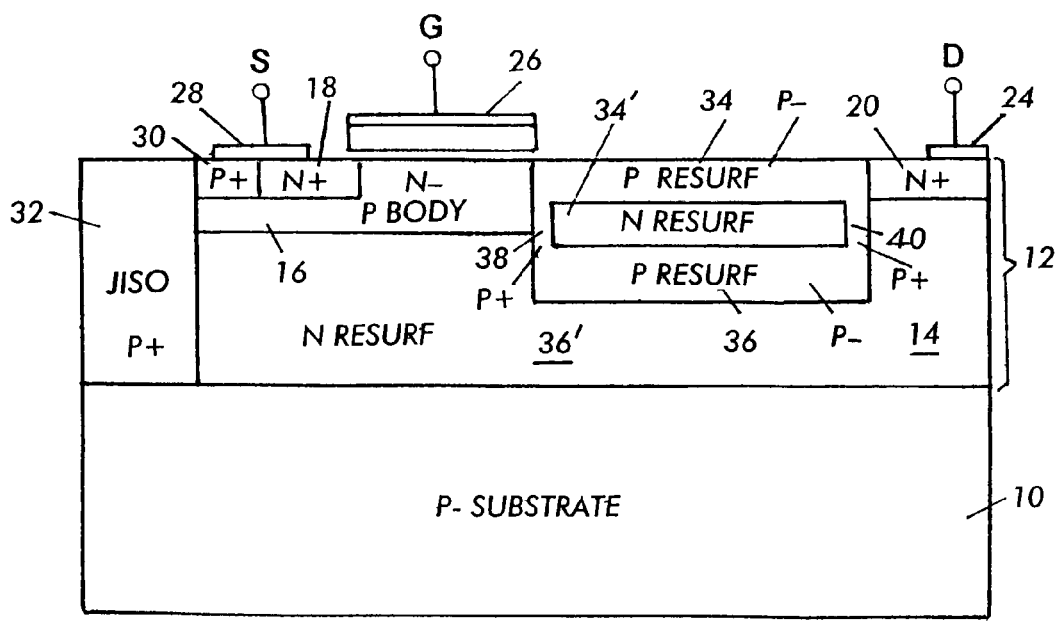
FIG. 6 shows a cross-sectional view of an LDMOST according to the fourth embodiment of the present invention.

Referring now to FIG. 6, in which like numerals identify like features, in a device according to the fourth embodiment of the present invention, a second region 40 of the same conductivity type as, and higher conductivity than, RESURF regions 34, 36 extends into drift region 14 and links first RESURF region 34 and second RESURF region 36. Note that, in this embodiment, preferably body region 16 is adjacent region 38, while drain region 20 is adjacent region 40 in the embodiment depicted by FIG. 6.

A device according to the fourth embodiment is preferably a P-channel device. Thus, drain region 20 is P+ doped, source region 18 is P+ doped, body region 16 is N− doped, and high conductivity contact region 30 is N+ doped. However, drift region 14 is N− doped, substrate 10 is P+ doped, junction isolation region 32 is P+ doped, regions 38 and 40 are P+ doped, RESURF regions 34 and 36 are P− doped, while regions 34' and 36' remain N− doped.

A device according to the fourth embodiment can use the same Quadruple RESURF action as in the device shown by FIG. 4 to achieve a high breakdown voltage in the off-state. In the ON state, the device uses two regions 38, 40 to increase the integrated charge to 3E12 cm-2 which is a factor of 3 higher than the existing technology, thus significantly reducing the $R_{dson}$ of the device.

In a device according to the present invention, there must be a charge balance between the alternating RESURF regions 34,34',36,36', which requires a tightly controlled process. Advantageously, a RESURF device according to the present invention can be implemented by using a single mask for implanting and forming region 34 and region 36.

Although in the embodiments described herein, the one conductivity type is P-type and the another conductivity type is N-type, a device according to the present invention can be devised in which the one conductivity type is N-type and the another conductivity is P-type without departing from the scope and spirit of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
a substrate of a first conductivity; and
a semiconductor device formed on a surface of said substrate, said semiconductor device including a drift region of a second conductivity having a RESURF conductivity, a base region formed in said drift region, a source region formed in said base region, a drain region formed in said drift region, a first RESURF region of said first conductivity adjacent a top surface of said drift region and formed between said base region and said drain region, and a second RESURF region of said first conductivity formed below said first RESURF region in said drift region spaced from said first RESURF region and said substrate by said drift region.

2. The power semiconductor device of claim 1, wherein said first conductivity is P type and said second conductivity is N type.

3. The power semiconductor device of claim 1, wherein said first conductivity is N type and said second conductivity is P type.

4. The power semiconductor device of claim 1, further comprising a MOS gate over said base region, a source contact in ohmic contact with said source region and a drain contact in ohmic contact with said drain region.

5. The power semiconductor device of claim 1, further comprising a high conductivity contact region of said first conductivity formed in said base region and in ohmic contact with said source contact.

6. A multiple lateral Reduced Surface Field ("RESURF") power semiconductor device, comprising:
a substrate of a first conductivity;
a RESURF drift region of a second conductivity, said RESURF drift region including a base region, a first region of a RESURF type of said first conductivity and a second region of a RESURF type of said first conductivity;
said first region of said RESURF type and said second region of said RESURF type located to reduce an on-resistance of said power semiconductor device.

7. The power semiconductor device of claim 6, wherein said first region of said RESURF type is adjacent to a top surface of said RESURF drift region.

8. The power semiconductor device of claim 6, further comprising:
a drain region formed within said RESURF drift region;

wherein said first region of said RESURF type is formed between said base region and said drain region.

9. The power semiconductor device of claim 6, wherein said second region of said RESURF type is spaced apart from said substrate.

10. The power semiconductor device of claim 6, wherein:
said RESURF drift region includes a drain region; and
said base region includes a source region.

11. The power semiconductor device of claim 6, further comprising:
a metal oxide semiconductor ("MOS") gate over said base region;
a source contact in ohmic contact with a source region formed within said base region;
a drain contact in ohmic contact with a drain region formed in said RESURF drift region.

12. The power semiconductor device of claim 6, where said first conductivity type is a P type and said second conductivity type is an N type.

13. A multiple lateral Reduced Surface Field ("RESURF") power semiconductor device, comprising:
a substrate of a first conductivity;
a RESURF drift region of a second conductivity, said RESURF drift region including a base region, a first region of a RESURF type and a second region of a RESURF type;
said first RESURF region and said second RESURF region of said first conductivity type.

14. The power semiconductor device of claim 13, wherein said first region is adjacent to a top surface of said RESURF drift region.

15. The power semiconductor device of claim 13, wherein said second region is spaced apart from said substrate.

* * * * *